(12) United States Patent
Park et al.

(10) Patent No.: US 12,088,317 B2
(45) Date of Patent: Sep. 10, 2024

(54) ANALOG TO DIGITAL CONVERTING DEVICE AND OPERATING METHOD THEREOF

(71) Applicant: SAMSUNG ELECTRONICS CO., LTD., Suwon-si (KR)

(72) Inventors: Sanggyu Park, Seoul (KR); Jaehyeong Park, Seoul (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 160 days.

(21) Appl. No.: 17/843,527

(22) Filed: Jun. 17, 2022

(65) Prior Publication Data

US 2022/0407533 A1    Dec. 22, 2022

(30) Foreign Application Priority Data

Jun. 21, 2021 (KR) .................. 10-2021-0080370

(51) Int. Cl.
*H03M 1/34* (2006.01)
*H03M 1/12* (2006.01)
*H03M 1/46* (2006.01)

(52) U.S. Cl.
CPC ........... *H03M 1/127* (2013.01); *H03M 1/462* (2013.01)

(58) Field of Classification Search
CPC ........ H03M 1/462; H03M 1/125; H03M 1/46; H03M 1/0863; H03M 1/38; H03M 1/466; H03M 1/468; H03M 1/42; H03M 1/0697; H03M 1/1009; H03M 1/12; H03M 1/1245; H03M 1/40; H03M 1/00; H03M 1/02; H03M 1/06; H03M 1/0602; H03M 1/0624; H03M 1/0695; H03M 1/08; H03M 1/0854; H03M 1/10; H03M 1/1023; H03M 1/1033; H03M 1/1071; H03M 1/1215; H03M 1/1265; H03M 1/127; H03M 1/804; H03M 3/426; H03M 3/464
USPC .................................. 341/118–121, 155, 172
See application file for complete search history.

(56) References Cited

U.S. PATENT DOCUMENTS

| | | | |
|---|---|---|---|
| 6,184,701 B1 | 2/2001 | Kim et al. | |
| 8,482,449 B1 * | 7/2013 | Zabroda | H03M 1/0863 341/172 |
| 8,872,691 B1 * | 10/2014 | Stepanovic | H03M 1/06 341/158 |

(Continued)

FOREIGN PATENT DOCUMENTS

KR    10-1774522 B1    9/2017

*Primary Examiner* — Linh V Nguyen
(74) *Attorney, Agent, or Firm* — Sughrue Mion, PLLC

(57) ABSTRACT

An analog-to-digital converting device configured to convert an analog signal into a digital signal, including a meta-stability detection unit configured to output a meta-stability signal based on a comparison result, wherein the comparison result is determined by comparing a comparison voltage of each bit of the digital signal with the analog signal; a counter configured to count a number of times that the comparison voltage of each bit of the digital signal is compared with the analog signal; and a control logic configured to detect a bit at which meta-stability has occurred from among bits of the digital signal based on the meta-stability signal and the counted number.

20 Claims, 12 Drawing Sheets

(56) References Cited

U.S. PATENT DOCUMENTS

| | | | | |
|---|---|---|---|---|
| 8,896,476 B2* | 11/2014 | Harpe | ...................... | H03M 1/02 |
| | | | | 341/118 |
| 8,988,268 B2* | 3/2015 | Sugimoto | ................ | H03M 1/38 |
| | | | | 341/118 |
| 9,203,407 B2 | 12/2015 | Baek et al. | | |
| 9,395,746 B2 | 7/2016 | Chung et al. | | |
| 9,484,945 B1* | 11/2016 | Wan | .................... | H03M 1/0863 |
| 9,614,540 B1* | 4/2017 | Kull | .................... | H03M 1/0607 |
| 9,621,179 B1* | 4/2017 | Maulik | ................ | H03M 1/0863 |
| 9,774,339 B2 | 9/2017 | Sun et al. | | |
| 9,813,073 B1 | 11/2017 | Trivedi | | |
| 10,044,364 B1* | 8/2018 | Sharif | ................... | H03M 1/468 |
| 10,187,079 B1 | 1/2019 | Sharif | | |
| 10,284,216 B1 | 5/2019 | Chung et al. | | |
| 11,387,838 B1* | 7/2022 | Dyer | ................... | H03M 1/1033 |
| 11,539,373 B2* | 12/2022 | Bandyopadhyay | ... | H03M 3/464 |
| 2020/0036387 A1* | 1/2020 | Tang | .................... | H03M 1/125 |
| 2020/0366309 A1 | 11/2020 | Zabroda | | |
| 2022/0182069 A1* | 6/2022 | Zabroda | ................ | H03M 1/462 |

* cited by examiner

ANALOG TO DIGITAL CONVERTING DEVICE AND OPERATING METHOD THEREOF

CROSS-REFERENCE TO RELATED APPLICATION

This application is based on and claims priority under 35 U.S.C. § 119 to Korean Patent Application No. 10-2021-0080370, filed on Jun. 21, 2021, in the Korean Intellectual Property Office, the disclosure of which is incorporated by reference herein in its entirety.

BACKGROUND

1. Field

The disclosure relates to an analog-to-digital converting device, and more particularly, to an analog-to-digital converting device configured to detect a bit at which meta-stability has occurred based on a meta-stability signal and the number of times counted by a counter for comparing a comparison voltage of each bit of a digital signal with an analog signal.

2. Description of Related Art

An analog-to-digital converting device may repeatedly compare a comparison voltage of each bit of a digital signal with an analog signal, and, as comparisons are repeatedly performed, a time required to compare the comparison voltages may become very long. In other words, meta-stability may occur. When all bits of a digital signal cannot be compared within one cycle, an error may occur in the output of the digital signal. An analog-to-digital converting device may prevent an error from occurring in a digital signal by detecting meta-stability.

The analog-to-digital converting device may be, for example, a successive approximation regulator (SAR) ADC, and, when meta-stability is detected, the operation of the analog-to-digital converting device may be stopped, thereby preventing an error from occurring in the digital signal. The analog-to-digital converting device may stop operating based on information regarding whether meta-stability has occurred and at which bit the meta-stability has occurred.

Generally, information regarding the bit at which meta-stability has occurred may be obtained using an activation signal that activates a memory corresponding to each bit of a digital signal and a memory corresponding to a bit to be compared. When a memory corresponding to each bit of a digital signal is activated by an activation signal and meta-stability occurs at a bit to be compared, the analog-to-digital converting device stores information regarding the meta-stability in an activated memory, thereby obtaining information regarding the bit at which meta-stability has occurred. However, since memories and activation signals respectively corresponding to bits of a digital signal are required, design complexity may be increased. Therefore, there is a need for an analog-to-digital converting device capable of detecting meta-stability without using a memory corresponding to each bit of a digital signal and an activation signal.

SUMMARY

Provided are an analog-to-digital converting device configured to detect a bit at which meta-stability has occurred based on a meta-stability signal and the number of times counted by a counter of comparing a comparison voltage of each bit of a digital signal with an analog signal and to control a digital signal to be output and an operating method of the analog-to-digital converting device.

Additional aspects will be set forth in part in the description which follows and, in part, will be apparent from the description, or may be learned by practice of the presented embodiments.

In accordance with an aspect of the disclosure, an analog-to-digital converting device configured to convert an analog signal into a digital signal includes a meta-stability detection unit configured to output a meta-stability signal based on a comparison result, wherein the comparison result is determined by comparing a comparison voltage of each bit of the digital signal with the analog signal; a counter configured to count a number of times that the comparison voltage of each bit of the digital signal is compared with the analog signal; and a control logic configured to detect a bit at which meta-stability has occurred from among bits of the digital signal based on the meta-stability signal and the counted number.

In accordance with an aspect of the disclosure, an analog-to-digital converting device configured to convert an analog signal into a digital signal includes a comparator configured to compare comparison voltages of bits of the digital signal with the analog signal, and output comparison results; a successive approximation register (SAR) logic configured to store values corresponding to comparison results for the bits of the digital signal; a clock generator configured to generate a first clock signal for operating the comparator; a meta-stability detection unit configured to output a meta-stability signal based on the comparison results; a counter configured to count a number of comparison operations of the comparator; and a control logic configured to detect a bit at which meta-stability has occurred from among bits of the digital signal based on the meta-stability signal and the counted number of the comparison operations.

In accordance with an aspect of the disclosure, an operating method of an analog-to-digital converting device includes comparing a comparison voltage of each bit of a digital signal with an analog signal according to a first clock signal; generating a meta-stability signal based on a result of the comparing; counting a number of times of that the comparing is performed; and detecting a bit at which meta-stability has occurred from among bits of the digital signal based on the meta-stability signal and the counted number.

In accordance with an aspect of the disclosure, an analog-to-digital converting device configured to convert an analog signal into a digital signal includes a comparator configured to perform at least one comparison operation by comparing comparison voltages of bits of the digital signal with the analog signal, and to output at least one comparison result; a meta-stability detection unit configured to output a meta-stability signal based on the at least one comparison result; a counter configured to count a number of times that the at least one comparison operation is performed; and a successive approximation register (SAR) logic configured to output the digital signal based on the at least one comparison result and the counted number wherein, based on a change in the meta-stability signal, the comparator is further configured to stop the at least one comparison operation, and the counter is further configured to stop the counting.

BRIEF DESCRIPTION OF THE DRAWINGS

The above and other aspects, features, and advantages of certain embodiments of the present disclosure will be more apparent from the following description taken in conjunction with the accompanying drawings in which.

DETAILED DESCRIPTION OF THE EMBODIMENTS

Figure 1:
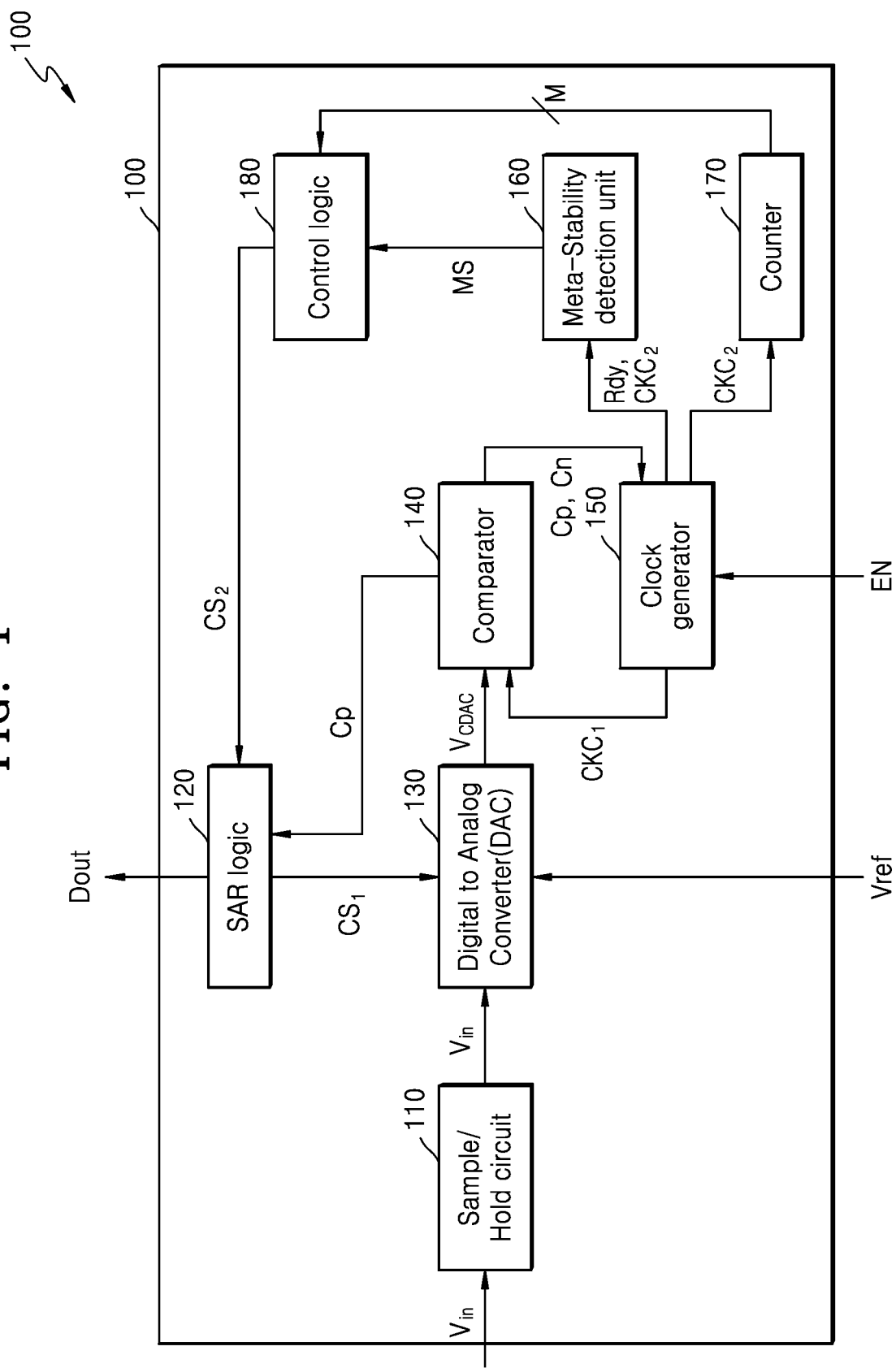
FIG. 1 is a block diagram schematically showing a plurality of components included in an analog-to-digital converting, according to an embodiment.

As is traditional in the field, embodiments may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a block diagram schematically showing a plurality of components included in an analog-to-digital converting device, according to embodiment.

Referring to FIG. 1, an analog-to-digital converting device 100 includes a sample/hold circuit 110, a successive approximation register (SAR) logic 120, a digital-to-analog converter (DAC) 130, a comparator 140, a clock generator 150, a meta-stability detection unit 160, a counter 170, and a control logic 180.

The analog-to-digital converting device 100 may receive an analog signal from the outside, for example an outside of the analog-to-digital converting device 100, and may perform a converting operation on the analog signal. For example, the analog-to-digital converting device 100 may receive a clock signal from the outside and perform a converting operation on an analog signal in synchronization with the clock signal. In an embodiment, the analog-to-digital converting device 100 may be an SAR analog-to-digital converter (ADC) that receives an analog signal to generate a digital signal from the analog signal. The SAR ADC may change a comparison voltage for each bit to be converted of a digital signal and compare a sampled signal with the comparison voltage.

The sample/hold circuit 110 may receive an input signal Vin, which is an analog signal, and perform a sampling operation. The sample/hold circuit 110 may generate a sampled signal from the input signal Vin and output the sampled signal to the DAC 130. Hereinafter, the input signal yin may refer to a sampled signal.

The SAR logic 120 may supply a control signal $CS_1$ to the DAC 130, and the DAC 130 may generate a comparison result voltage $V_{CDAC}$ in response to the control signal $CS_1$. The comparison result voltage $V_{CDAC}$ may be a voltage for determining a logic level of a corresponding bit digit through comparison of the comparison voltage with a voltage level of an analog signal. An embodiment of determining a logic level according to a result of comparing the comparison voltage with a voltage level of an analog signal will be described in detail below with reference to FIGS. 3 and 4.

The control signal $CS_1$ may refer to a signal for controlling switching devices of a DAC to set a comparison voltage for each bit. The SAR logic 120 may receive a per-bit comparison result Cp of comparing the analog signal with the comparison voltage $V_{CDAC}$ of each bit of bits of a digital signal Dout from the comparator 140, and store values corresponding to the per-bit comparison result Cp.

The DAC 130 may generate a comparison result voltage $V_{CDAC}$ for each bit to be generated from digital signal including a plurality of bits based on a reference voltage VREF applied from the outside. The comparison result voltage $V_{CDAC}$ may have a voltage level obtained by adding or subtracting the voltage level of the reference voltage $V_{REF}$ to or from the voltage level of the input signal $V_{in}$ received from the sample/hold circuit 110. The DAC 130 may perform a switching operation to generate a comparison result voltage $V_{CDAC}$ for each bit based on the control signal CS1 output from the SAR logic 120. An embodiment in which the DAC 130 generates a comparison result voltage $V_{CDAC}$ for each bit will be described later with reference to FIGS. 3 and 4.

The comparator 140 may generate comparison results Cp and Cn by comparing a comparison voltage of each bit of the digital signal with the analog signal. The comparator 140 may generate the comparison results Cp and Cn by comparing the comparison voltage of each bit of the digital signal with the input signal $V_{in}$. When the comparator 140 completes a comparison operation, a comparison result Cp and a comparison result Cn may be different values. For example, the comparison result Cp may have a logic high level, and the comparison result Cn may have a logic low level. When the comparator 140 is reset or a comparison operation is not completed, the comparison result Cp and the comparison result Cn may be the same. For example, the comparison result Cp and the comparison result Cn may have a logic high level. When the comparator 140 is reset, the comparator 140 may output the comparison result Cp and the comparison result Cn, which are the same values, without performing a comparison operation.

In an example embodiment, the comparator 140 may compare the comparison voltage with the analog signal by comparing the comparison result voltage $V_{CDAC}$ generated by the DAC 130 with a ground voltage, thereby generating the comparison results Cp and Cn. The comparison results Cp and Cn may be voltages. For example, the DAC 130 may generate a comparison result voltage $V_{CDAC}$ for determining the logic level of a most significant bit (MSB) based on the input signal $V_{in}$ and the comparison voltage, and the comparator 140 may compare a difference between the comparison result voltage $V_{CDAC}$ with the ground voltage. As a result of one or more of the comparisons discussed above, when the comparison result voltage $V_{CDAC}$ is lower than the ground voltage, the comparator 140 may output the comparison result Cp having a logic high level and the comparison result Cn having a logic low level. When the comparison result voltage $V_{CDAC}$ is higher than the ground voltage, the comparator 140 may output the comparison result Cp having a logic low level and the comparison result Cn having a logic high level.

The comparator 140 may provide data regarding comparison results generated for each bit to the SAR logic 120, and the SAR logic 120 may generate a control signal $CS_1$ for generating a comparison voltage for a next bit based on received data regarding comparison results. The comparator 140 may provide one of the comparison results Cp and Cn to the SAR logic 120. For example, the comparator 140 may provide the comparison result Cp to the SAR logic 120, and the SAR logic 120 may generate the control signal $CS_1$ based on the comparison result Cp received from the comparator 140.

The SAR logic 120 may determine a comparison voltage for a next bit based on the comparison result Cp. For example, when the comparison result Cp having a logic high level is output in response to the MSB, the SAR logic 120 may determine a voltage higher than a comparison voltage corresponding to the MSB as the comparison voltage corresponding to a next bit. When the comparison result Cp having a logic low level is output in response to the MSB, the SAR logic 120 may determine a voltage lower than the comparison voltage corresponding to the MSB as the comparison voltage corresponding to a next bit. In other words, the voltage level of the comparison voltage corresponding to a less significant bit may differ according to the logic level of a more significant bit.

The clock generator 150 may generate a first clock signal $CKC_1$. The first clock signal $CKC_1$ may refer to a signal for operating the comparator 140. The comparator 140 may perform a comparison operation in synchronization with the first clock signal $CKC_1$. For example, the comparator 140 may perform a comparison operation at a rising-edge of the first clock signal $CKC_1$. The comparison results Cp and Cn of the comparator 140 may be obtained by comparing a comparison voltage for each bit of the digital signal Dout with an analog signal in synchronization with the first clock signal $CKC_1$.

In an example embodiment, the clock generator 150 may generate the first clock signal $CKC_1$ based on the comparison results Cp and Cn. For example, the clock generator 150 may generate the first clock signal $CKC_1$ asynchronously. The clock generator 150 may receive an enable signal EN that controls activation and suppression of the operation of the clock generator 150. The first clock signal $CKC_1$ may be initially triggered by the enable signal EN, and subsequent pulses of the first clock signal $CKC_1$ may be generated based on the comparison results Cp and Cn. For example, the clock generator 150 may receive the comparison result Cp and the comparison result Cn having different logic levels, output a logic low level, receive the comparison result Cp and the comparison result Cn having the same level as a generated logic low level that is input to the comparator 140, and output a logic high level, thereby generating the first clock signal $CKC_1$ for performing a comparison operation for each bit. The clock generator 150 may generate the first clock signal $CKC_1$ based on a calculation result Rdy of performing a calculation using the comparison results Cp and Cn.

The clock generator 150 may generate a second clock signal $CKC_2$ by delaying the first clock signal $CKC_1$. The second clock signal $CKC_2$ may refer to a clock signal obtained by delaying the first clock signal $CKC_1$ by a time sufficient for the comparator 140 to perform a comparison operation. The second clock signal $CKC_2$ may be provided to the meta-stability detection unit 160 and the counter 170.

The meta-stability detection unit 160 may output a meta-stability signal MS based on the comparison results Cp and Cn obtained by comparing the comparison voltage for each bit with an analog signal. For example, the meta-stability detection unit 160 may output the meta-stability signal MS based on the calculation result Rdy obtained by performing a calculation using the comparison result Cp and the comparison result Cn. For example, the meta-stability detection unit 160 may output the meta-stability signal MS indicating whether meta-stability has occurred based on the calculation result Rdy obtained by performing a NAND calculation using the comparison result Cp and the comparison result Cn.

The meta-stability detection unit 160 may operate in synchronization with the second clock signal $CKC_2$. In an example embodiment, the meta-stability detection unit 160 may latch the calculation result Rdy on the rising-edge of the second clock signal $CKC_2$ and output a result thereof as the meta-stability signal MS.

Meta-stability may occur when a time elapsed for a comparison operation of the comparator 140 increases. When a comparison operation of the comparator 140 is not completed even at a time point sufficiently delayed for performing the comparison operation from a time point at which the comparator 140 begins the comparison operation, it may be determined that meta-stability has occurred. Therefore, the meta-stability detection unit 160 may output the meta-stability signal MS including information regarding whether meta-stability has occurred by operating in synchronization with the second clock signal CKC2. For example, when a comparison operation is completed at a rising-edge of the second clock signal $CKC_2$ and the calculation result Rdy obtained by performing a calculation by using the comparison result Cp and the comparison result Cn having different logic levels is received, the meta-stability detection unit 160 may output the meta-stability signal MS having a logic level indicating that meta-stability has not occurred. When the calculation result Rdy obtained by performing a calculation by using the comparison result Cp and the comparison result Cn having the same logic level is received, the meta-stability detection unit 160 may output the meta-stability signal MS indicating that meta-stability has occurred.

When meta-stability occurs, the logic level of the meta-stability signal MS may change. When the second clock signal $CKC_2$ is triggered, the calculation result Rdy latched by the meta-stability detection unit 160 when meta-stability occurs is different from the calculation result Rdy latched by the meta-stability detection unit 160 when meta-stability has not occurred, and thus the logic level of the meta-stability signal MS output by the meta-stability detection unit 160 may differ. For example, meta-stability signals regarding bits more significant than a bit at which meta-stability has occurred may have a logic high level in synchronization with the second clock signal $CKC_2$, and a meta-stability signal regarding the bit at which meta-stability has occurred may have a logic low level. Therefore, when meta-stability occurs, the logic level of the meta-stability signal MS output by the meta-stability detection unit 160 may change. The meta-stability signal MS may be provided to the control logic 180.

In an example embodiment, the clock generator 150 may stop generating the first clock signal $CKC_1$ based on a change in the logic level of the meta-stability signal MS. Because the logic level of the meta-stability signal MS is changed when meta-stability occurs, the operation of the clock generator 150 may be stopped to prevent an error from being output to the digital signal Dout. When the clock generator 150 stops generating the first clock signal $CKC_1$, the comparator 140 operating in synchronization with the first clock signal $CKC_1$ may also stop a comparison operation. As an example, the meta-stability signal MS may control the enable signal EN, and, when the logic level of the meta-stability signal MS is changed, the operation of the clock generator 150 may be stopped by the enable signal EN.

The counter 170 may count the number of times that comparison voltage for each bit is compared with an analog signal. The counter 170 may count the number of times that comparison operations are performed by the comparator 140 by counting each time the comparator 140 performs a comparison operation. In an example embodiment, the counter 170 may count the number of times the comparison voltage is compared with an analog signal by counting pulses of the second clock signal $CKC_2$. Since the comparator 140 performs a comparison operation in synchronization with the first clock signal $CKC_1$, the counter 170 may count the number of times that comparison operations are performed by the comparator 140 by counting pulses of the second clock signal $CKC_2$ that is obtained by delaying the first clock signal $CKC_1$. For example, the counter 170 may count up at every rising-edge of the second clock signal $CKC_2$.

The counter 170 may stop a counting operation when meta-stability occurs and the logic level of the meta-stability signal MS is changed. When meta-stability occurs, the clock generator 150 may stop generating the first clock signal $CKC_1$, and, when the first clock signal $CKC_1$ is not generated, the second clock signal $CKC_2$ is not generated. Because the counter 170 counts according to the second clock signal $CKC_2$, when the second clock signal $CKC_2$ is not generated, the counter 170 may stop a counting operation.

The counter 170 may stop a counting operation and store the number of times that comparison operations have been performed until the logic level of the meta-stability signal MS is changed. The counter 170 may store a counted value M counted until the counting operation of the counter 170 is stopped. When the operation of the counter 170 is stopped, the number of times that comparisons have been performed until meta-stability occurred may be stored in the counter 170, and the counted value M stored in the counter 170 may refer to a bit at which meta-stability has occurred from among bits of the digital signal Dout. The counted value M may be provided to the control logic 180.

The control logic 180 may detect a bit at which meta-stability has occurred from among bits of the digital signal Dout based on the meta-stability signal MS and the number of comparisons counted by the counter 170. The control logic 180 may detect a bit at which meta-stability has occurred from among bits of the digital signal Dout based on the meta-stability signal MS indicating whether meta-stability has occurred and the counted value M indicating a bit at which meta-stability has occurred. For example, when the logic level of the meta-stability signal MS is changed and the counted value M indicating that comparisons have been performed twice is received, the control logic 180 may detect that meta-stability has occurred in a bit following the MSB.

When the control logic 180 detects a bit at which meta-stability has occurred, the control logic 180 may output a control signal $CS_2$ for controlling the SAR logic 120 to output the digital signal Dout based on a detected bit. The control logic 180 may output the control signal $CS_2$ by which the SAR logic 120 may differently control values of each bits output as the digital signal Dout according to whether the corresponding bits are more significant than a bit at which meta-stability is detected. For example, the control logic 180 may output the control signal $CS_2$ for controlling the SAR logic 120 to output bits that are more significant than the bit at which meta-stability is detected as values corresponding to comparison results stored in the SAR logic 120 and output bits that are not more significant than the bit at which meta-stability is detected as pre-set values. When meta-stability occurs, it may correspond to case where the comparison voltage for each bit and an analog signal have been sufficiently compared. Therefore, by controlling to output bits that are not more significant than a bit at which meta-stability has occurred as pre-set values, an error-free digital signal Dout may be generated. Although the control logic 180 and the SAR logic 120 are shown as different components in FIG. 1, embodiments are not limited thereto, and any one of the control logic 180 and the SAR logic 120 may be included in the other.

The SAR logic 120 may receive the control signal $CS_2$ and generate a digital signal Dout based on the control signal $CS_2$. Based on the control signal $CS_2$, the SAR logic 120 may output a bit that is more significant than a bit at which meta-stability is detected from among bits of the digital signal Dout as a value corresponding to a comparison result stored in the SAR logic 120. For example, when meta-stability is detected at a third bit from among 5 bits, the SAR logic 120 may output a MSB and a bit more significant than the third bit following the MSB as values corresponding to comparison results stored in the SAR logic 120 based on the control signal $CS_2$.

The SAR logic 120 may output bits less significant than the bit at which meta-stability is detected from among bits of the digital signal and the bit at which meta-stability is detected as pre-set values based on the control signal $CS_2$. For example, when meta-stability is detected at the third bit from among 5 bits, the SAR logic 120 may output the third bit and a fourth bit and fifth bit, which are bits less significant than the third bit, as pre-set values based on the control signal $CS_2$.

The comparator 140 may provide the comparison result Cp corresponding to respective bits from the MSB to the least significant bit (LSB) to the SAR logic 120, and the SAR logic 120 may output a digital signal $D_{out}$ based on the comparison result Cp corresponding to the respective bits and the control signal $CS_2$. The digital signal $D_{out}$ generated by the SAR logic 120 may be, for example, data information including a series of bits.

When the digital signal Dout is output by the SAR logic 120, one cycle may end, and, when one cycle ends, the DAC 130 may be reset and the comparison voltage may be reset. Resetting of the comparison voltage may be an operation of returning a digital input voltage of the comparison voltage to an initial value to convert a sampled signal into a digital signal thereafter. When one cycle ends, the analog-to-digital converting device 100 may perform a sampling operation on an analog signal thereafter. When one cycle ends, the counter 170 may be reset.

Figure 2:
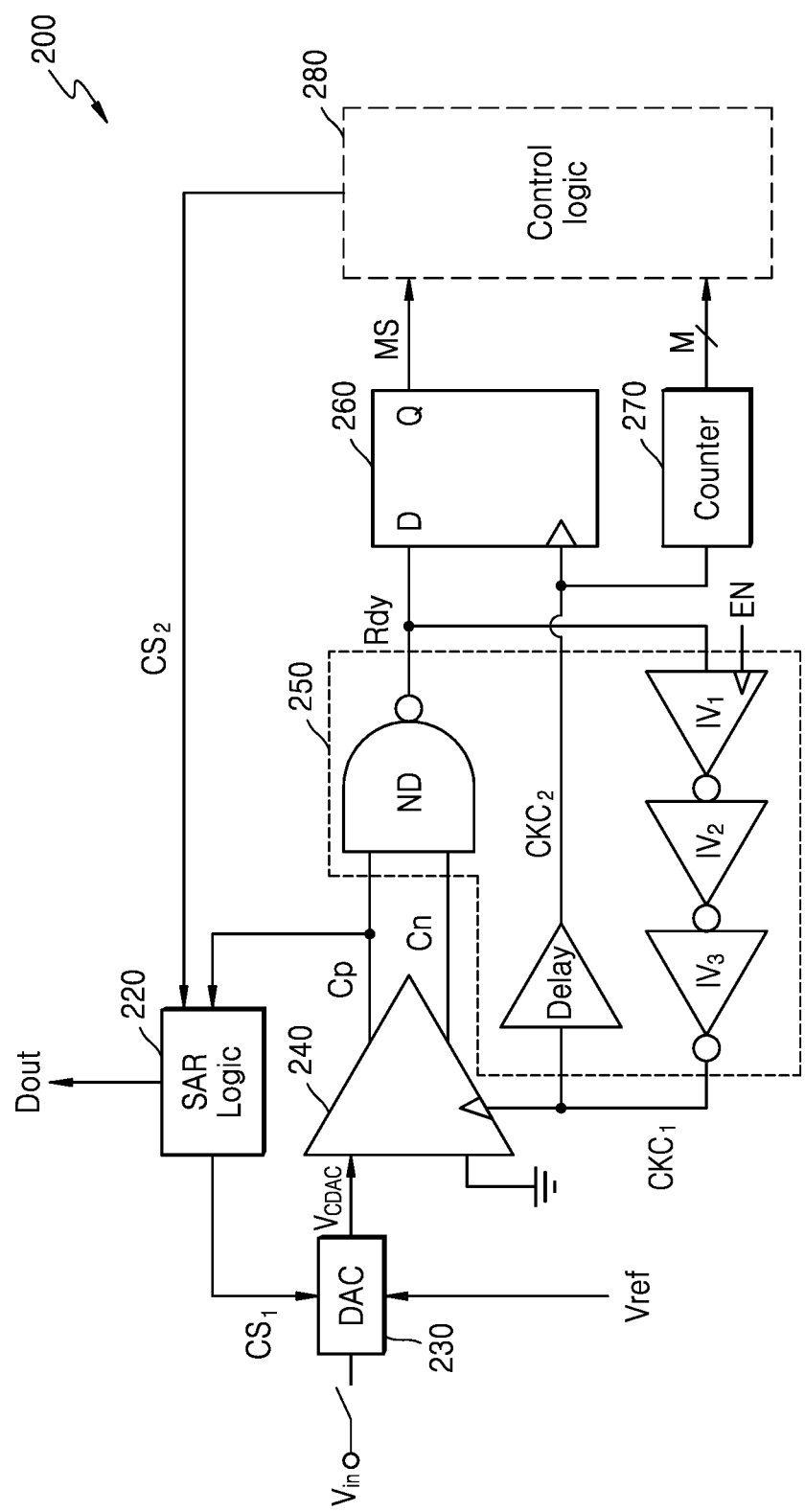
FIG. 2 is a diagram showing components of an analog-to-digital converting device according to FIG. 1, according to an embodiment.

FIG. 2 is a diagram showing components of an analog-to-digital converting device according to FIG. 1.

Referring to FIG. 2, an analog-to-digital converting device 200 may include a SAR logic 220, a DAC 230, a comparator 240, a clock generator 250, and a meta-stability detection unit 260, a counter 270, and a control logic 280. The analog-to-digital converting device 200, the SAR logic 220, the DAC 230, the comparator 240, the clock generator 250, the meta-stability detection unit 260, the counter 270, and the control logic 280 of FIG. 2 may correspond to the analog-to-digital converting device 100, the SAR logic 120, the DAC 130, the comparator 140, the clock generator 150, the meta-stability detection unit 160, the counter 170, and the control logic 180 of FIG. 1, respectively. Therefore, redundant descriptions may be omitted.

The clock generator 250 may include a NAND gate ND, a delay buffer Delay, and inverter devices $IV_1$, $IV_2$, and $IV_3$. The NAND gate ND may perform a NAND operation on the comparison results Cp and Cn and output the calculation result Rdy. For example, when the comparator 240 completes a comparison operation and outputs the comparison result Cp and the comparison result Cn having different logic levels, the output of the NAND gate ND may have a logic high level.

The inverter devices $IV_1$, $IV_2$, and $IV_3$ may output the first clock signal $CKC_1$ by inverting the calculation result Rdy output from the NAND gate ND. An odd number of inverter devices $IV_1$, $IV_2$, and $IV_3$ may be provided. Although FIG. 2 shows that there are three inverter devices $IV_1$, $IV_2$, and $IV_3$, the number of inverter devices is not necessarily limited to the above-described example.

When the output of the NAND gate ND has a logic high level, the first clock signal $CKC_1$, which is an output of the inverter devices $IV_1$, $IV_2$, and $IV_3$, becomes a logic low level, and thus the comparator 240 may be reset. When the comparator 240 is reset, the comparison result Cp and the comparison result Cn having the same logic level are output, the calculation result Rdy becomes a logic low level, the first clock signal $CKC_1$ becomes a logic high level, and the comparator 240 may perform a comparison operation. The operation of the clock generator 250 may be repeated to generate the first clock signal $CKC_1$, and the operation of the clock generator 250 may be stopped by the enable signal EN.

In an example embodiment, the meta-stability detection unit 260 may be a flip-flop. For example, the meta-stability detection unit 260 may be a D flip-flop. The meta-stability detection unit 260 may latch the calculation result Rdy on the rising-edge of the second clock signal $CKC_2$ and output a result thereof as the meta-stability signal MS.

Figure 3:
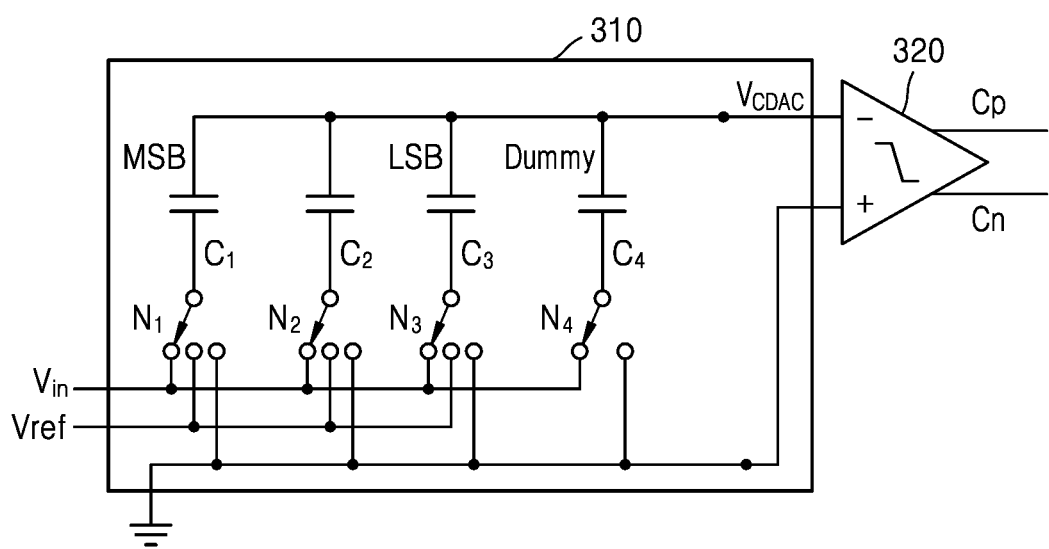
FIG. 3 is a circuit diagram showing a digital-to-analog converter (DAC) and a comparator of an analog-to-digital converting device according to an embodiment.
Figure 4:
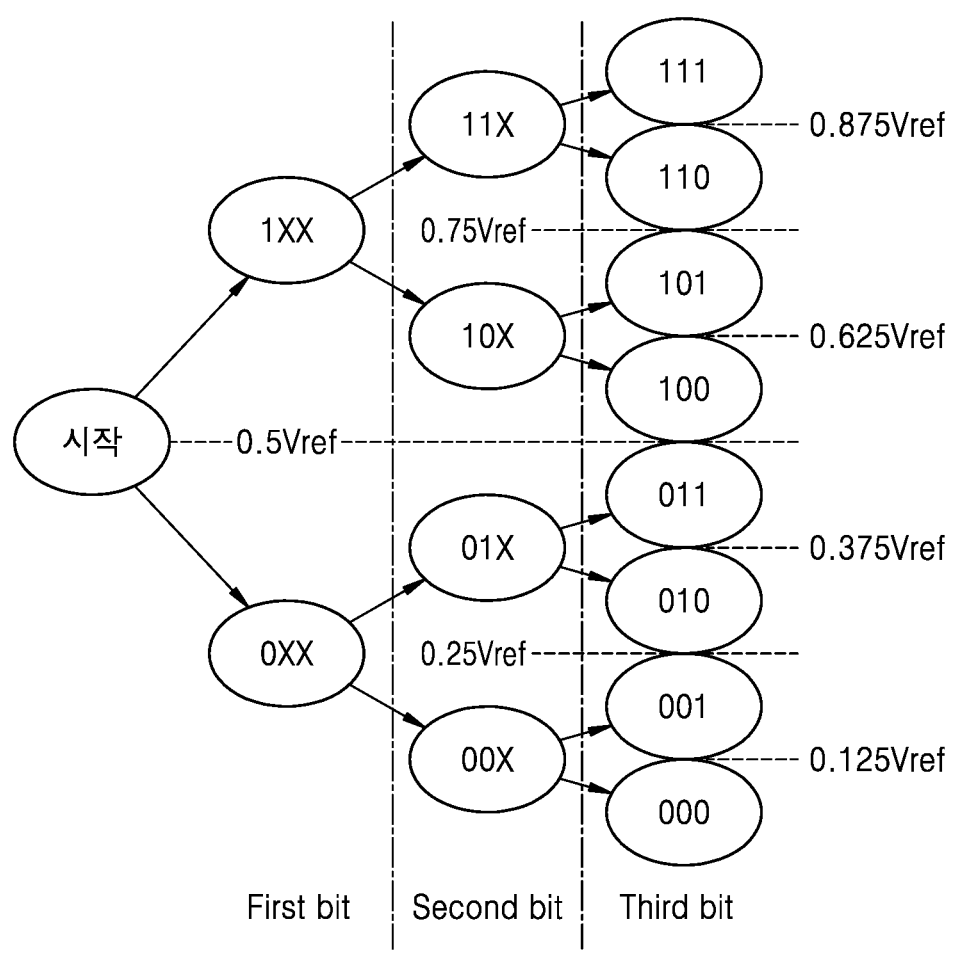
FIG. 4 is a graph showing data of a digital signal generated according to a comparison between a comparison voltage and a voltage level of an input signal, according to an embodiment.

FIG. 3 is a circuit diagram showing a DAC and a comparator of an analog-to-digital converting device according to an example embodiment, and FIG. 4 is a graph showing data of a digital signal generated according to a comparison between a comparison voltage and a voltage level of an input signal.

FIG. 3 shows an embodiment of a DAC 310 and a comparator 320 that receive an input signal yin in a single ended manner and perform an analog-to-digital converting operation. The DAC 310 and the comparator 320 of FIG. 3 may correspond to the DAC 230 and the comparator 240 of FIG. 2, respectively. Therefore, redundant descriptions may be omitted.

In one embodiment, DAC 310 may be a capacitive DAC (CDAC). The DAC 310 may perform a switching operation to generate the comparison voltage for each bit based on a control signal output from a SAR logic (e.g., the SAR logic 220 of FIG. 2). The DAC 310 is not limited to the embodiment according to FIG. 3 and may include all embodiments in which a plurality of comparison voltages may be generated under the control of a switch array and any one of the comparison voltages may be compared with a common voltage. For example, the DAC 310 may receive the input signal Vin in a differential manner and perform an analog-to-digital converting operation. Hereinafter, an embodiment of generating a 3-bit digital signal from an analog signal will be described with reference to FIGS. 3 and 4.

Referring to FIG. 3, the DAC 310 according to an example embodiment may include a capacitor array including four comparison voltage capacitors $C_1$ to $C_4$ and a switch array including four comparison voltage switches $N_1$ to $N_4$. The comparison voltage capacitors $C_1$ to $C_4$ of the capacitor array may be connected to the switches $N_1$ to $N_4$ of the switch array, respectively. For example, first to third comparison voltage capacitors $C_1$ to $C_3$ may be connected to first to third comparison voltage switches $N_1$ to $N_3$, respectively.

From among the comparison voltage capacitors $C_1$ to $C_4$ of the capacitor array, the first to third comparison voltage capacitors $C_1$ to $C_3$ may be capacitors for generating data corresponding to first to third bits, respectively, and a fourth comparison voltage capacitor $C_4$ may be a dummy capacitor. In this case, a first bit may be the MSB among three bits constituting a data signal, and a third bit may be the LSB.

When the DAC 310 performs a converting operation for generating a first bit, the DAC 310 may switch a first comparison voltage switch $N_1$ connected to a first comparison voltage capacitor $C_1$. When the DAC 310 performs a converting operation for generating a second bit, the DAC 310 may switch a second comparison voltage switch $N_2$ connected to a second comparison voltage capacitor $C_2$. In the same regard, when the DAC 310 performs a converting operation for generating a third bit, the DAC 310 may switch a third comparison voltage switch $N_3$ connected to a third comparison voltage capacitor $C_3$.

The capacitance of the first comparison voltage capacitor $C_1$ for generating data of the MSB may be twice the capacitance of the second comparison voltage capacitor $C_2$ for generating data of a bit less significant than the MSB, and the capacitance of the second comparison voltage capacitor $C_2$ may be twice the capacitance of the third comparison voltage capacitor $C_3$ for generating data of the LSB. Here, the capacitance of the third comparison voltage capacitor $C_3$ and the capacitance of the fourth comparison voltage capacitor $C_4$, which is a dummy capacitor, may be the same.

The DAC 310 may generate the comparison voltage corresponding to a bit to be converted through a switching operation. Before generating data of the MSB, all of the first to third comparison voltage switches $N_1$ to $N_3$ may be connected to a node of the input signal yin. At this time, amounts of charges Q stored in the first to fourth comparison voltage capacitors $C_1$ to $C_4$ may be as shown in Equation 1 below.

$$Q=(C_1+C_2+C_3+C_4)*(V_{in}) \quad \text{[Equation 1]}$$

Here, to generate the comparison voltage of the MSB, the first comparison voltage switch $N_1$ may be switched to the reference voltage Vref, the second comparison voltage switch $N_2$ and the third comparison voltage switch $N_3$ may be switched to the ground voltage. The amounts of charges stored in the comparison voltage capacitors $C_1$ to $C_4$ may have a relationship as shown in Equation 2 below to satisfy the charge conservation law.

$$(C_1+C_2+C_3+C_4)*(V_{in})=C_1*(V_{REF}-V_{CDAC})+(C_2+C_3+C_4)*(-V_{CDAC}) \quad \text{[Equation 2]}$$

Here, when the capacitance of the first comparison voltage capacitor $C_1$ is 4C, the capacitance of the second comparison voltage capacitor $C_2$ is 2C, and the capacitances of the third comparison voltage capacitor $C_3$ and the fourth comparison voltage capacitor $C_4$ are C, the comparison voltage $V_{CDAC}$ satisfying Equation 2 may be as shown in Equation 3 below.

$$V_{CDAC}=-V_{in}+1/2*V_{REF} \quad \text{[Equation 3]}$$

In embodiments, the comparison voltage for the MSB may be expressed as $1/2*V_{REF}$, as shown in Equation 3. The comparator 320 may determine the logic levels of the comparison results Cp and Cn by comparing the voltage level of the ground voltage with the voltage level of the comparison result voltage $V_{CDAC}$ to generate bit data of the MSB. The −terminal of the comparator 320 is connected to an output node of the DAC 310, and the +terminal of the comparator 320 is connected to the ground voltage. Therefore, the logic levels of the comparison results Cp and Cn to be output may be determined according to the voltage level sign of a difference between the comparison result voltage $V_{CDAC}$ and the ground voltage. When the ground voltage is higher than the comparison result voltage $V_{CDAC}$, the input signal yin is greater than $1/2*V_{REF}$, and thus the logic level of the comparison result Cp is a logic high level, the logic level of the comparison result Cn is a logic low level, and data of the MSB may be '1'. When the comparison result voltage $V_{CDAC}$ is higher than the ground voltage, the input signal yin is less than $1/2*V_{REF}$, and thus the logic level of the comparison result Cp is a logic low level, the logic level of the comparison result Cn is a logic high level, and data of the MSB may be '0'.

In an example embodiment, the comparison voltage for respective bits may be different from one another, and the comparison voltage of a bit to be converted may be set based on the comparison results Cp and Cn of a bit more significant than the bit to be converted. The comparison voltage of the bit to be converted may be set according to the logic level of the comparison results Cp and Cn of a bit more significant than the bit to be converted. The DAC 310 may perform different switching operations corresponding to a less significant bit according to the logic level of a more significant bit. For example, the DAC 310 may perform different switching operations for a switch array according to the logic level of the MSB. When the logic level of the MSB is a logic high level, the first comparison voltage switch $N_1$ may be switched to a node to which the reference voltage $V_{REF}$ is applied, and, when the logic level of the MSB is a logic low level, the first comparison voltage switch $N_1$ may be switched to a node to which the ground voltage is applied.

The case where the ground voltage has a value greater than that of the comparison result voltage $V_{CDAC}$ corresponds to the case where the input signal yin has a value greater than that of a voltage $1/2*$Vref, wherein the comparison result Cp may have high-level data, for example data having a high logic level, and the comparison result Cn may have low-level data, for example data having a low logic level. A SAR logic (e.g., SAR logic 220 of FIG. 2) may apply the control signal $CS_1$ to the DAC 310, the control signal $CS_1$ for connecting the first comparison voltage switch $N_1$ and the second comparison voltage switch $N_2$ to the node to which the reference voltage $V_{REF}$ is input and maintaining connection of the third comparison voltage switch $N_3$ and the fourth comparison voltage switch $N_4$ to the node to which the ground voltage is applied. At this time, the voltage level of the comparison voltage of a second bit for satisfying the charge conservation law may be as shown in Equation 4 below.

$$V_{CDAC}=-V_{in}+1/4*V_{REF}+1/8*V_{REF} \quad \text{[Equation 4]}$$

In embodiments, the comparison voltage for the second bit may be expressed as $1/4*V_{REF}+1/8*V_{REF}$, as shown in Equation 3. The comparator 320 may determine the logic levels of the comparison results Cp and Cn by comparing the voltage level of the ground voltage with the voltage level of the comparison result voltage $V_{CDAC}$ to generate data of the second bit, which is a bit following the MSB.

The case where the ground voltage has a value smaller than that of the comparison result voltage $V_{CDAC}$ corresponds to the case where the input signal $V_{in}$ has a value smaller than that of a voltage $(1/4*V_{REF}+1/8*V_{REF})$, wherein the comparison result Cp may have low-level data, and data of the second bit may be '0'.

The SAR logic may switch the second comparison voltage switch $N_2$ to the node to which the ground voltage is input and switch the third comparison voltage switch $N_3$ to the node to which the reference voltage $V_{REF}$ is input. At this time, the voltage level of the comparison voltage of a third bit for satisfying the charge conservation law may be as shown in Equation 5 below.

$$V_{CDAC}=-V_{in}+1/2*V_{REF}+1/4*V_{REF}-1/8*V_{REF} \quad \text{[Equation 5]}$$

In embodiments, the comparison voltage for the third bit may be expressed as $V_{in}+1/2*V_{REF}+1/4*V_{REF}-1/8*V_{REF}$, as shown in Equation 3. The case where the ground voltage has a value greater than that of the comparison voltage $V_{CDAC}$ corresponds to the case where the input signal Vin has a value greater than that of a voltage $1/2*V_{REF}+1/4*V_{REF}=1/8*V_{REF}$, wherein the comparison result Cp may have low-level data, for example data having a low logic level, and data of the third bit may be '1'.

Referring to FIG. 4, the DAC 310 may update the comparison voltages from the MSB to the LSB through the switching operation of the DAC while performing the converting operation on one sampled signal and may determine data of a digital signal according to a result of comparing the comparison result voltages $V_{CDAC}$ with the ground voltage.

In an example embodiment, the lesser the significance of the bit to be converted is, the smaller a voltage difference between the comparison voltage of a bit to be converted and the comparison voltage of a more significant bit closest to the bit to be converted may be. As the DAC 310 performs a converting operation from the MSB to the LSB, the voltage difference between the comparison voltage of the bit to be converted and the comparison voltage of the more significant bit closest to the bit to be converted may become smaller. For example, the voltage difference between the comparison voltage when performing a converting operation on the second bit and the comparison voltage when performing a converting operation on the MSB (the first bit) may be 0.25 $V_{REF}$. Meanwhile, the voltage difference between the comparison voltage when performing a converting operation on the third bit and the comparison voltage when performing a converting operation on the second bit may be 0.125 $V_{REF}$. In other words, more precise voltage shifting may be needed to perform a converting operation on less significant bits, to perform an accurate comparison operation.

Figure 5A:
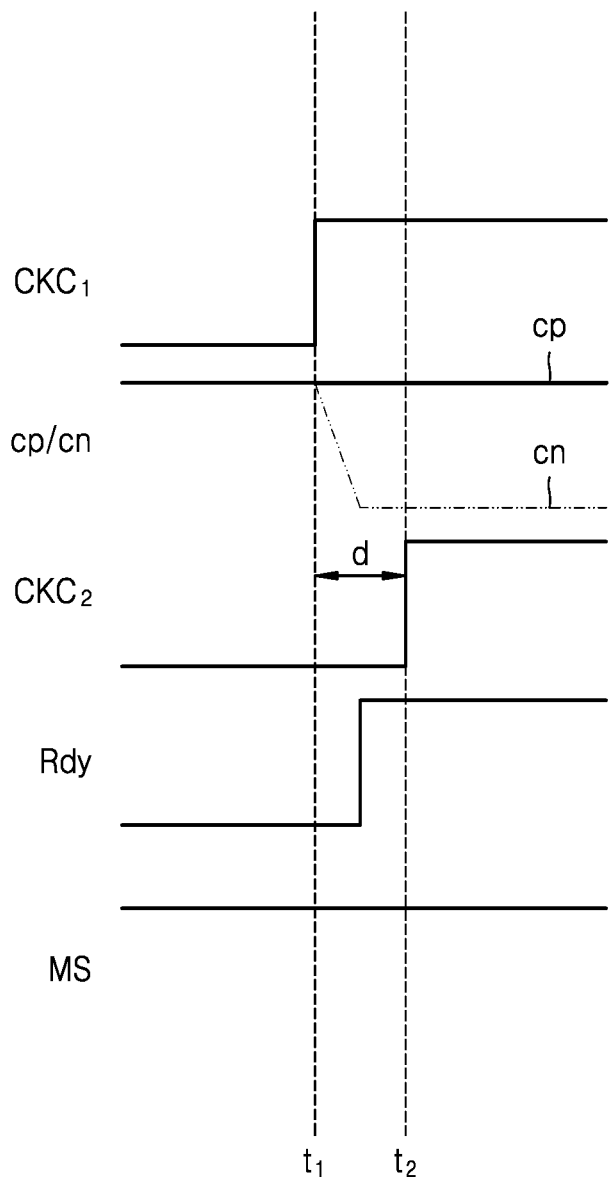
FIG. 5A is a graph for describing a case where meta-stability has not occurred according to an embodiment.
Figure 5B:
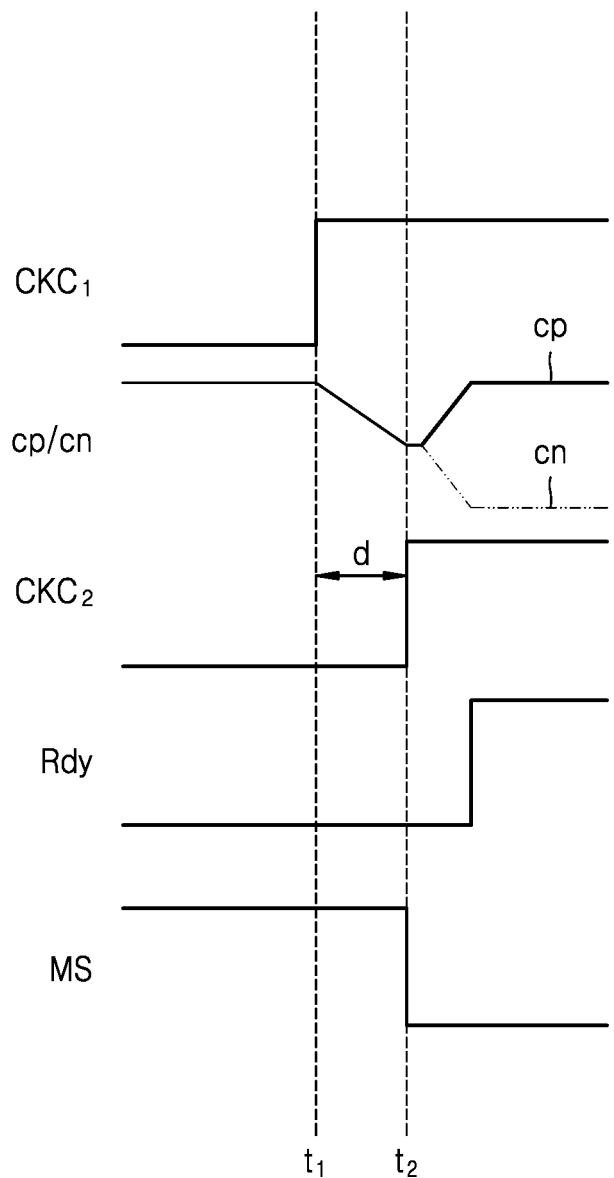
FIG. 5B is a graph for describing a case where meta-stability has occurred according to an embodiment.

FIG. 5A is a graph for describing a case where meta-stability has not occurred according to an example embodiment, and FIG. 5B is a graph for describing a case where meta-stability has occurred according to an example embodiment.

Referring to FIG. 5A, the first clock signal $CKC_1$ may be triggered at a time point $t_1$, and the second clock signal $CKC_2$ may be triggered at time point $t_2$ delayed from the time point $t_1$ by time d.

The case where a comparison operation for comparing a comparison voltage of each bit with an analog signal is completed when the second clock signal $CKC_2$ is triggered may correspond to a case where meta-stability has not occurred in the bit being compared. When the second clock signal $CKC_2$ is triggered at the rising-edge, the logic level of the comparison result Cp may be different from the logic level of the comparison result Cn. For example, when the second clock signal $CKC_2$ is triggered at the rising-edge, the comparison result Cp may have a logic high level and the comparison result Cn may have a logic low level. When the second clock signal $CKC_2$ is triggered at the rising-edge, the comparison result Cp and the comparison result Cn have different logic levels, and thus the calculation result Rdy may have a logic high level, and, as the comparison operation of a comparator is completed, meta-stability may not occur.

At the rising-edge of the second clock signal $CKC_2$, the calculation result Rdy has a logic high level, and thus the calculation result Rdy may be latched and output as the meta-stability signal MS. Since the comparison operation of the comparator is completed at the rising-edge of the second clock signal $CKC_2$, the calculation result Rdy has a logic high level, and the meta-stability signal MS may maintain a logic high level.

Referring to FIG. 5B, the case where a comparison operation for comparing a comparison voltage of each bit with an analog signal is not completed when the second clock signal $CKC_2$ is triggered may correspond to a case where meta-stability has occurred in the bit being compared. When the second clock signal $CKC_2$ is triggered at the rising-edge, the logic level of the comparison result Cp may be the same as the logic level of the comparison result Cn. For example, when the second clock signal $CKC_2$ is triggered at the rising-edge, the logic levels of the comparison result Cp and the comparison result Cn may be an intermediate level between a logic high level and a logic low level. When the second clock signal $CKC_2$ is triggered at the rising-edge, the comparison result Cp and the comparison result Cn have the same logic level, and thus the calculation result Rdy may have a logic low level. Therefore, the case may correspond to a case where meta-stability has occurred, because the comparison operation of a comparator is not completed.

At the rising-edge of the second clock signal $CKC_2$, the calculation result Rdy has a logic low level, and thus the calculation result Rdy may be latched and output as the meta-stability signal MS. Since meta-stability has occurred because the comparison operation of the comparator is not completed at the rising-edge of the second clock signal $CKC_2$, the calculation result Rdy may have a logic low level, and the meta-stability signal MS at the rising-edge of the second clock signal $CKC_2$ may have at a logic low level. As meta-stability occurs, the logic level of the meta-stability signal MS may be changed from a logic high level to a logic low level at the rising-edge of the second clock signal $CKC_2$.

Figure 6A:
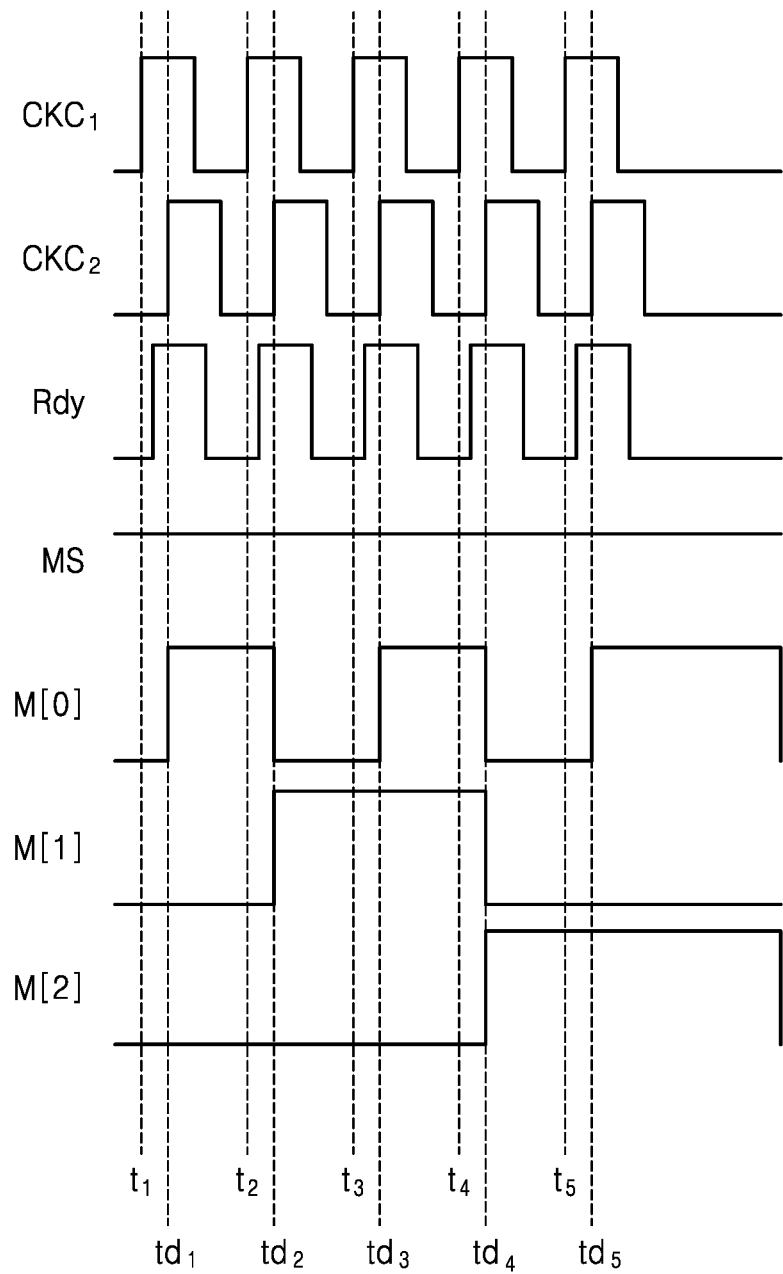
FIG. 6A is a graph for describing the operation of a counter in a case where meta-stability has not occurred according to an embodiment.
Figure 6B:
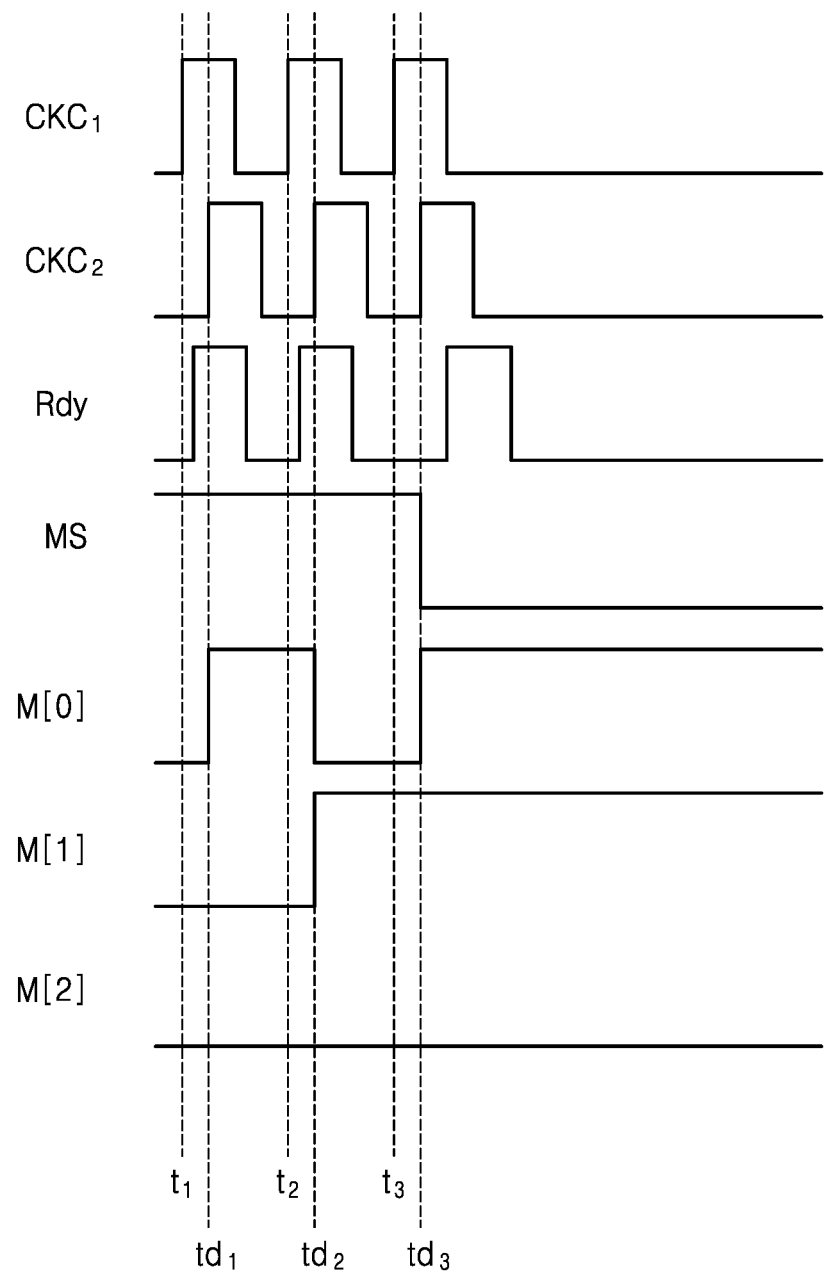
FIG. 6B is a graph for describing the operation of a counter in a case where meta-stability has occurred according to an embodiment.

FIG. 6A is a graph for describing an operation of a counter in a case where meta-stability has not occurred according to an example embodiment, and FIG. 6B is a graph for describing an operation of the counter in a case where meta-stability has occurred according to an example embodiment.

Referring to FIG. 6A, the counter may count at the rising-edge of the second clock signal $CKC_2$. A number of bits of the counter may be determined such that the maximum countable value of the counter is equal to or greater than the number of bits of a digital signal. For example, when a digital signal include 5 bits, a 3-bit counter may be used, and the maximum countable value of the 3-bit counter may be 8. Hereinafter, an embodiment of generating a 5-bit digital signal from an analog signal will be described with reference to FIGS. 6A and 6B.

When the first clock signal $CKC_1$ is triggered at the time point $t_1$, the comparison voltage of a first bit may be compared with an analog signal. Time points $td_1$, $td_2$, $td_3$, $td_4$, and $td_5$ may be delayed time points which correspond to time points $t_1$, $t_2$, $t_3$, $t_4$, $t_5$, respectively. When the second clock signal $CKC_2$ is triggered at a time point $td_1$, the comparison operation for the first bit is completed and meta-stability has not occurred, and thus the meta-stability signal MS may have a logic high level. Because the counter counts the number of comparison operations according to the second clock signal $CKC_2$, when the second clock signal $CKC_2$ is triggered at the time point $td_1$, a counted value M[2:0] may be 001.

When the first clock signal $CKC_1$ is triggered at a time point $t_2$, the comparison voltage of a second bit is compared with the analog signal, and, when the second clock signal $CKC_2$ is triggered at a time point $td_2$, meta-stability has not occurred. Therefore, the meta-stability signal MS may have a logic high level, and the counted value M[2:0] may be 010.

When the first clock signal $CKC_1$ is triggered at a time point $t_3$, the comparison voltage of a third bit is compared with the analog signal, and, when the second clock signal $CKC_2$ is triggered at a time point $td_3$, meta-stability has not occurred. Therefore, the meta-stability signal MS may have a logic high level, and the counted value M[2:0] may be 011. Since meta-stability has not occurred at a fourth bit, the counted value M[2:0] may be 100, and, since meta-stability has not occurred at a fifth bit, the counted value M[2:0] may be 101. The counter may be reset when a comparison operation on bits constituting a digital signal is completed.

Referring to FIG. 6B, when the first clock signal $CKC_1$ is triggered at the time point $t_3$, the comparison voltage of the third bit may be compared with the analog signal. When the second clock signal $CKC_2$ is triggered at the time point $td_3$, the comparison operation for the first bit is not completed, and thus the calculation result Rdy has a logic low level, and meta-stability occurs. Therefore, the meta-stability signal MS may have a logic low level. Since the counter counts the number of comparison operations according to the second clock signal $CKC_2$, when the second clock signal $CKC_2$ is triggered at the time point td3, a counted value M[2:0] may be 011.

Because meta-stability has occurred, the generation of the first clock signal $CKC_1$ and the second clock signal $CKC_2$ may be stopped, and the counting operation of the counter may be stopped. The counter may stop the counting operation, store 011, which is the counted value M[2:0] when the counting operation is stopped, and provide the counted value M[2:0] to a control logic. A stored counted value may be information regarding a bit at which meta-stability has occurred.

The control logic may detect or determine a bit at which meta-stability has occurred based on the counted value M[2:0] and the meta-stability signal MS. For example, the control logic may determine that meta-stability has occurred at the third bit, which may be referred to as detecting the third bit at which meta-stability has occurred based on the counted value M[2:0] of 011 and a change in the logic level of the meta-stability signal MS.

An SAR logic may generate a digital signal based on a control signal output from the control logic. The SAR logic may output the first bit and the second bit as values corresponding to comparison results stored in the SAR logic and output the third bit, the fourth bit, and the fifth bit as pre-set values. For example, the pre-set value may be one of 011 and 100, but is not limited thereto.

Figure 7:
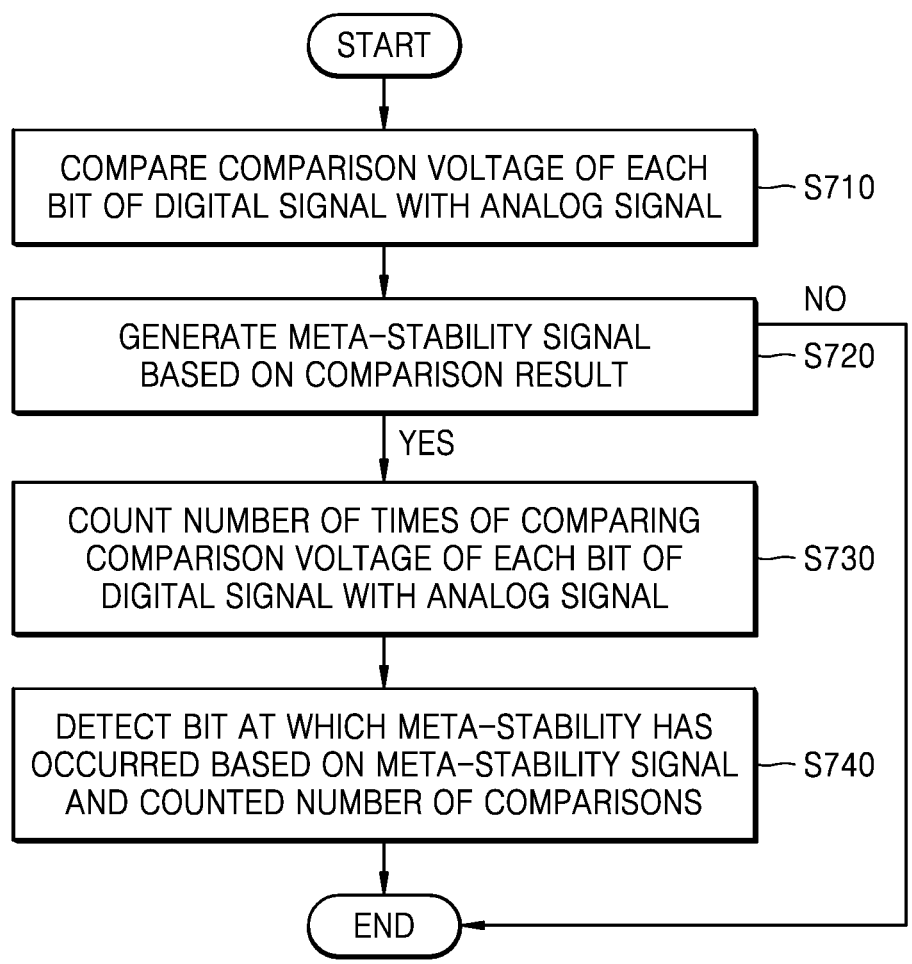
FIG. 7 is a flowchart for describing an operation of an analog-to-digital converting device according to an embodiment.

FIG. 7 is a flowchart for describing an operation of an analog-to-digital converting device according to an example embodiment.

The method of FIG. 7 may be performed by the analog-to-digital converting device described above with reference to FIGS. 1 to 6.

The analog-to-digital converting device may compare comparison voltages of each bit of a digital signal with an analog signal according to a first clock signal in operation S710, and may generate a meta-stability signal based on a comparison result of comparing the comparison voltage of each bit of the digital signal with the analog signal in operation S720. A comparison operation for comparing the comparison voltage of each bit with the analog signal may be performed in synchronization with the first clock signal, and, based on a comparison result, the meta-stability signal may be generated in synchronization with a second clock signal.

In operation S730, the analog-to-digital converting device may count the number of times that the comparison voltage of each bit of the digital signal is compared with the analog signal. The analog-to-digital converting device can count the number of comparisons by counting up every time the comparison voltage corresponding to each bit of the digital signal is compared with the analog signal. The number of comparisons may be counted by counting the pulses of the second clock signal that is generated by delaying the first clock signal. Since the counter stops its operation when meta-stability occurs, the counter may store the number of comparison operations counted until meta-stability occurs. The analog-to-digital converting device may obtain information regarding a bit at which meta-stability has occurred from among bits constituting the digital signal by using the counter. The analog-to-digital converting device may compare the comparison voltage of a first bit of the digital signal with the analog signal at operation S710, generate a meta-stability signal for the first bit based on a comparison result of comparing the comparison voltage of the first bit with the analog signal at operation S720, and count after the comparison of the comparison voltage of the first bit with the analog signal at operation S730. Operations S710 to S730 may be repeated until meta-stability occurs in one of the bits of the digital signal. Operations S710 to S730 may be repeated until the logic level of the meta-stability signal is changed.

In operation S740, the analog-to-digital converting device may detect a bit at which meta-stability has occurred from among the bits of the digital signal based on the meta-stability signal and a counted number of comparisons. By controlling the digital signal based on a detected bit, the analog-to-digital converting device may output an error-free digital signal.

Figure 8:
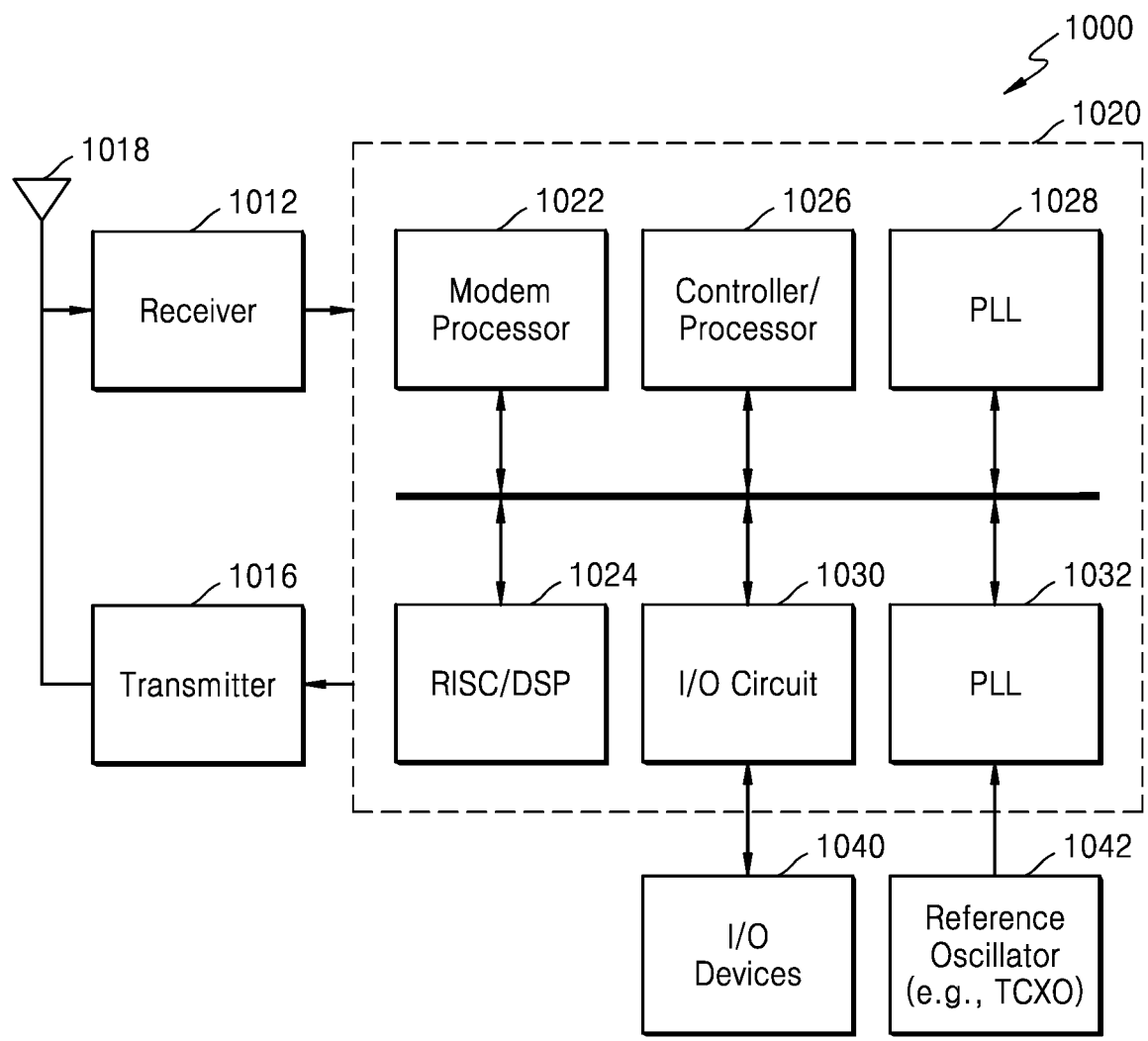
FIG. 8 is a block diagram of a communication device according to an embodiment.

FIG. 8 is a block diagram of a communication device according to an embodiment.

Referring to FIG. 8, a communication device 1000 may include a receiver 1012, a transmitter 1016, a communication module 1020, an antenna 1018, an input/output device 1040, and a reference oscillator 1042. The receiver 1012 may include the analog-to-digital converting device 100 or 200 that performs an analog-to-digital converting operation according to the embodiments described above with reference to FIGS. 1 to 7. The receiver 1012 may convert an analog signal received from the outside through the antenna 1018 into a digital signal by using the analog-to-digital converting device 100 or 200 and provide the digital signal to the communication module 1020. The transmitter 1016 may convert the digital signal received from the communication module 1020 into an analog signal and output the analog signal to the outside through the antenna 1018.

The communication module 1020 may include a modem processor 1022, a RISC/DSP 1024, a controller/processor 1026, a memory 1028, an input/output device 1030, and a phase locked loop 1032.

The modem processor 1022 may perform a processing operation for data transmission and data reception, e.g., encoding, modulation, demodulation, and decoding. The RISC/DSP 1024 may perform a common processing operation or a processing operation specialized to the communication device 1000. The controller/processor 1026 may control blocks inside the controller/processor 1026. The memory 1028 may store data and various instruction codes. The input/output device 1030 may communicate with the input/output device 1040 outside the communication module 1020. The input/output device 1030 may include the analog-to-digital converting device 100 or 200 that performs an analog-to-digital converting operation according to the embodiments described above with reference to FIGS. 1 to 7. The input/output device 1030 may convert a data signal received from the input/output device 1040 into a digital signal by using the analog-to-digital converting device 100 or 200. The phase locked loop 1032 may perform a frequency modulation operation by using a frequency signal received from the reference oscillator 1042. The reference oscillator 1042 may be implemented as a crystal oscillator (XO), a voltage controlled crystal oscillator (VCXO), a temperature compensated crystal oscillator (TCXO), etc. The communication module 1020 may perform a processing operation needed for communication by using output signals generated by the phase locked loop 1032.

Figure 9:
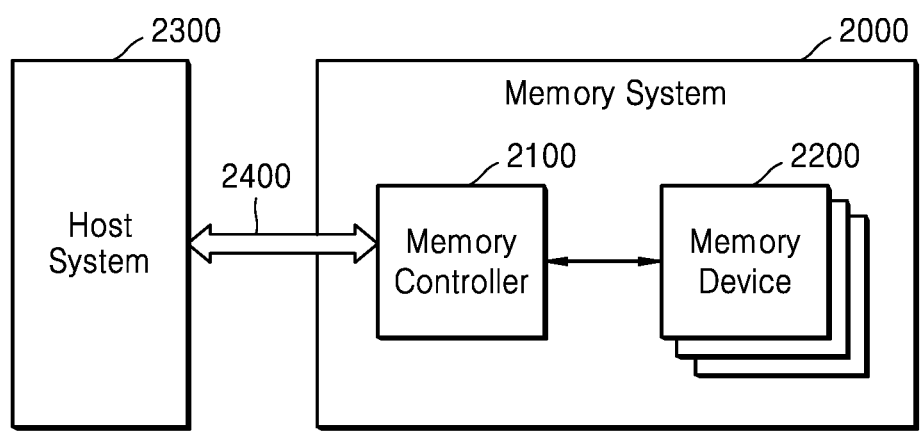
FIG. 9 is a block diagram showing systems according to an embodiment.

FIG. 9 is a block diagram showing systems according to an embodiment.

As shown in FIG. 9, a memory system 2000 and a host system 2300 may communicate with each other through an interface 2400, and the memory system 2000 may include a memory controller 2100 and memory devices 2200.

The interface 2400 may use electrical signals and/or optical signals and, as a non-limiting example, may be implemented as a serial advanced technology attachment (SATA) interface, SATA express (SATAe) interface, a serial attached small computer system interface (SCSI) (SAS), an universal serial bus (USB) interface, or a combination thereof. The host system 2300 and the memory controller 2100 may include a SerDes for a serial communication.

In some embodiments, the memory system 2000 may communicate with the host system 2300 by being removably coupled to the host system 2300. The memory devices may be volatile memories or non-volatile memories, and the memory system 2000 may also be referred to as a storage system. For example, as a non-limiting example, the memory system 2000 may be implemented by a solid-state drive or solid-state disk (SSD), an embedded SSD (eSSD), a multimedia card (MMC), an embedded multimedia card (eMMC), etc. The memory controller 2100 may control the memory devices 2200 in response to a request received from the host system 2300 through the interface 2400.

The analog-to-digital converting device 100 or 200 to which the above embodiments are applied may be implemented to be included in each of the memory controller 2100, the memory devices 2200, and the host system 2300. In detail, the memory controller 2100, the memory devices 2200, and the host system 2300 may each receive a PAMn-based data signal and convert the data signal into digital data through a scheme according to embodiments.

Figure 10:
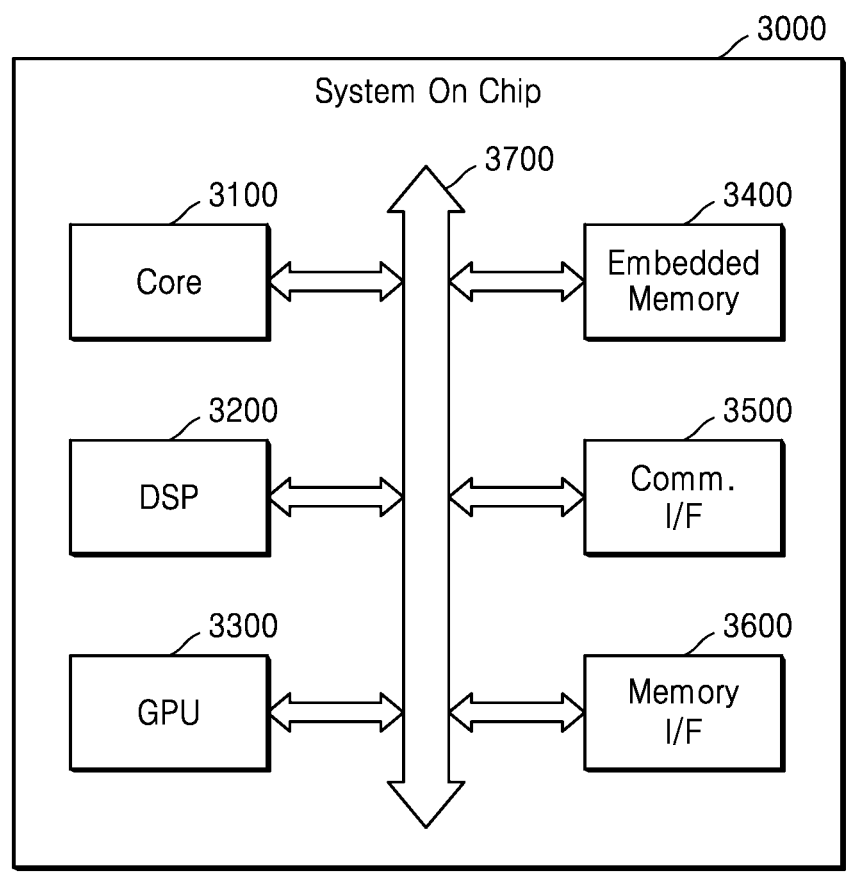
FIG. 10 is a block diagram showing a system-on-chip according to an embodiment.

FIG. 10 is a block diagram showing a system-on-chip according to an embodiment.

A system on chip (SoC) 3000 may refer to an integrated circuit on which parts of a computing system or other electronic systems are integrated. For example, as an example of the SoC 3000, an application processor (AP) may include a processor and parts for other functions.

Referring to FIG. 10, the SoC 3000 may include a core 3100, a digital signal processor (DSP) 3200, a graphics processing unit (GPU) 3300, an embedded memory 3400, a communication interface 3500, and a memory interface 3600. The components of the SoC 3000 may communicate with one another through a bus 3700.

The core 3100 may process instructions and control operations of the components included in the SoC 3000. For example, the core 3100 may process a series of instructions, thereby driving an operating system and executing applications on the operating system. The DSP 3200 may generate useful data by processing digital signals, e.g., digital signals provided from the communication interface 3500. The GPU 3300 may generate data for images output through a display device from image data provided from the embedded memory 3400 or the memory interface 3600 or encode image data. The embedded memory 3400 may store data needed for operations of the core 3100, the DSP 3200, and the GPU 3300. The memory interface 3600 may provide an interface for an external memory of the SoC 3000, e.g., a dynamic random access memory (DRAM), a flash memory, etc.

The communication interface 3500 may provide a serial communication between the SoC 3000 and an external device. For example, the communication interface 3500 may access an Ethernet and may include a SerDes for a serial communication.

The analog-to-digital converting device 100 or 200 of the above embodiments may be applied to the communication interface 3500 and the memory interface 3600. In detail, the communication interface 3500 or the memory interface 3600 may receive a PAMn-based data signal and convert the data signal into digital data through a scheme according to embodiments.

While embodiments have been particularly shown and described, it will be understood that various changes in form and details may be made therein without departing from the spirit and scope of the following claims.

What is claimed is:

1. An analog-to-digital converting device configured to convert an analog signal into a digital signal, the analog-to-digital converting device comprising:
    a meta-stability detection unit configured to output a meta-stability signal based on a comparison result, wherein the comparison result is determined by comparing a comparison voltage of each bit of the digital signal with the analog signal;
    a counter configured to count a number of times that the comparison voltage of each bit of the digital signal is compared with the analog signal; and
    a control logic configured to detect a bit at which meta-stability has occurred from among bits of the digital signal based on the meta-stability signal and the counted number,
    wherein the counter is further configured to count the counted number by counting pulses of a clock signal input to the counter.

2. The analog-to-digital converting device of claim 1, wherein, based on the meta-stability occurring and a logic level of the meta-stability signal being changed, the counter is configured to stop a counting operation.

3. The analog-to-digital converting device of claim 1, wherein the comparison result is obtained by comparing the comparison voltage of the each bit of the digital signal with the analog signal according to a first clock signal.

4. The analog-to-digital converting device of claim 3, wherein the meta-stability detection unit is further configured to output the meta-stability signal based on the comparison result according to a second clock signal that is generated by delaying the first clock signal.

5. The analog-to-digital converting device of claim 4, wherein the comparison result is generated according to the first clock signal, and
    wherein the counter is further configured to count the counted number by counting pulses of the second clock signal.

6. The analog-to-digital converting device of claim 1, further comprising a successive approximation register (SAR) logic configured to store values corresponding to comparison results of the bits of the digital signal, and to output the digital signal based on a control signal output from the control logic,
    wherein the SAR logic is further configured to output the digital signal based on the control signal and the detected bit.

7. The analog-to-digital converting device of claim 6, wherein the SAR logic is further configured to output, based on the control signal, another bit more significant than the detected bit from among the bits of the digital signal as a value corresponding to the comparison results stored in the SAR logic.

8. The analog-to-digital converting device of claim 6, wherein the SAR logic is further configured to output, based on the control signal, another bit that is less significant than the detected bit and the detected bit as pre-set values.

9. The analog-to-digital converting device of claim 1, wherein comparison voltages of the bits of the digital signal are different from each other, and
    wherein a second comparison voltage of a second bit is set based on a previous comparison result corresponding to a first bit, wherein the first bit is more significant than the second bit.

10. The analog-to-digital converting device of claim 9, wherein a difference between the second comparison voltage and a first comparison voltage of the first bit is larger than a difference between the second comparison voltage and a third comparison voltage of a third bit, wherein the second bit is more significant than the third bit.

11. An analog-to-digital converting device configured to convert an analog signal into a digital signal, the analog-to-digital converting device comprising:
    a comparator configured to compare comparison voltages of bits of the digital signal with the analog signal, and output comparison results;
    a successive approximation register (SAR) logic configured to store values corresponding to comparison results for the bits of the digital signal;
    a clock generator configured to generate a first clock signal for operating the comparator;
    a meta-stability detection unit configured to output a meta-stability signal based on the comparison results;
    a counter configured to count a number of comparison operations of the comparator; and
    a control logic configured to detect a bit at which meta-stability has occurred from among bits of the digital signal based on the meta-stability signal and the counted number of the comparison operations,
    wherein the counter is further configured to count the counted number by counting pulses of a clock signal input to the counter.

12. The analog-to-digital converting device of claim 11, wherein the clock generator is further configured to stop generation of the first clock signal based on a change in a logic level of the meta-stability signal.

13. The analog-to-digital converting device of claim 12, wherein, based on the generation of the first clock signal being stopped, the counter is further configured to stop a counting operation and store the counted number of the comparison operations performed before the change in the logic level of the meta-stability.

14. The analog-to-digital converting device of claim 11, wherein the clock generator is further configured to:
    generate the first clock signal based on the comparison results, and
    generate a second clock signal by delaying the first clock signal.

15. The analog-to-digital converting device of claim 14, wherein the meta-stability detection unit is further configured to output the meta-stability signal based on the comparison results according to the second clock signal.

16. The analog-to-digital converting device of claim 14, wherein the counter is further configured to count the counted number by counting pulses of the second clock signal.

17. The analog-to-digital converting device of claim 11, wherein, based on a control signal output from the control logic, the SAR logic is further configured to output bits more significant than the detected bit at from among the bits of the digital signal as values corresponding to the comparison results stored in the SAR logic, and to output the detected bit and bits less significant than the detected bit as pre-set values.

18. An analog-to-digital converting device configured to convert an analog signal into a digital signal, the analog-to-digital converting device comprising:
    a comparator configured to perform at least one comparison operation by comparing comparison voltages of bits of the digital signal with the analog signal, and to output at least one comparison result;
    a meta-stability detection unit configured to output a meta-stability signal based on the at least one comparison result;
    a counter configured to count a number of times that the at least one comparison operation is performed; and
    a successive approximation register (SAR) logic configured to output the digital signal based on the at least one comparison result and the counted number,
    wherein, based on a change in the meta-stability signal, the comparator is further configured to stop the at least one comparison operation, and the counter is further configured to stop the counting, and
    wherein the counter is further configured to count the counted number by counting pulses of a clock signal input to the counter.

19. The analog-to-digital converting device of claim 18, further comprising a control logic configured to detect a bit at which meta-stability has occurred, from among bits of the digital signal, based on the meta-stability signal and the counted number.

20. The analog-to-digital converting device of claim 19, wherein the digital signal includes a most significant bit (MSB) and a least significant bit (LSB),
    wherein the MSB is more significant than the detected bit, and the LSB is less significant than the detected bit, and
    wherein the SAR logic is further configured to determine a value of the MSB based on the at least one comparison result, and to determine values of the detected bit and the LSB based on predetermined values.

* * * * *